United States Patent [19]

Ibbetson

[11] Patent Number: 4,541,031

[45] Date of Patent: Sep. 10, 1985

[54] LOOP FAULT ISOLATOR

[75] Inventor: David N. I. Ibbetson, Toronto, Canada

[73] Assignee: Derek W. Moore, Rexdale, Canada

[21] Appl. No.: 554,065

[22] Filed: Nov. 21, 1983

[51] Int. Cl.³ .............................................. H02H 7/26
[52] U.S. Cl. ........................................ 361/67; 361/65;
  361/79; 324/52; 340/825.16; 455/8
[58] Field of Search ...................... 361/65, 66, 68, 67,
  361/60, 79, 36, 170, 62, 69; 324/52; 340/825.16,
  825.17, 825.06, 825.87; 178/69 R; 455/8, 9

[56] References Cited

U.S. PATENT DOCUMENTS

| 2,786,988 | 3/1957 | Bergman | 340/825.16 X |
|---|---|---|---|
| 3,040,309 | 6/1962 | Miller | 361/170 X |
| 3,309,688 | 3/1967 | Yanishevsky | 340/825.16 X |
| 3,444,321 | 5/1969 | Pantos | 340/825.16 X |
| 3,467,889 | 9/1969 | Brough-Cunningham et al. | 361/64 |
| 3,714,452 | 1/1973 | Williamson | 361/67 X |
| 3,796,920 | 3/1974 | Hedrick et al. | 361/69 X |
| 3,909,677 | 9/1975 | McClain | 361/67 |
| 4,047,155 | 9/1977 | Miller | 340/825.06 X |
| 4,390,835 | 6/1983 | Elkateb et al. | 361/79 X |

Primary Examiner—Patrick R. Salce
Attorney, Agent, or Firm—George A. Rolston

[57] ABSTRACT

The invention comprises a method and a device for locating, isolating and by-passing a defective electrical device in an electrical circuit, and comprising sensing current and voltage at a first point in such circuit, on one side of such device, whereby the current and voltage are not significantly altered by the sensing process, sensing current and voltage at a second point in such circuit, on the other side of such device, whereby the current and voltage are not significantly altered by the sensing process, comparing such currents and voltages as between such two points, creating a control signal responsive to such compared currents and voltages, and, isolating such device from such circuit, and thereafter re-establishing such circuit whereby to by-pass such device, in response to a control signal of predetermined characteristics.

15 Claims, 6 Drawing Figures

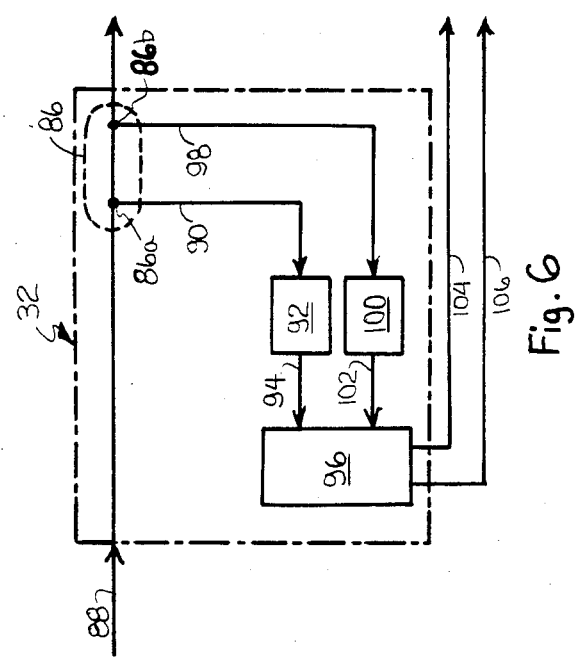

LOOP FAULT ISOLATOR

The invention relates to a method and a device for detecting faults in electrical lines, circuits, or devices, for isolating same automatically, and for identifying the location of the said fault within the said line, circuit or device.

BACKGROUND OF THE INVENTION

Electrical or electronic systems may often contain a series of elemental devices connected to a master device, which receives electrical signals from the series of elemental devices. The master device may also transmit signals to the elemental devices. If one of the elemental devices becomes defective, the signals to or from the maser device may be interrupted or altered.

An interruption may cause the operation of the entire system to halt until the fault is corrected. Thus, the fault in the single device may cause the entire system to become idle. Time must be expended to identify the faulty device and to effect repairs before the system becomes operational again.

An unexpected alteration of the signal may cause the system to operate incorrectly. Many systems require the continued accurate operation of the system and, consequently, the rapid identification and repair of any defect which will affect the output of the system is of extreme importance. A fault in an elemental device may remain undetected for some time. Even though it may be known that a defect exists, the identification of the precise location of the defect may require a significant amount of time. Until such time as the fault is repaired, the system will either be inoperative or function improperly.

In order to avoid interruption and to protect the integrity of the signal, it is desirable to isolate and by-pass the defective device, until repairs are effected.

Common means for isolating and by-passing devices may make use of breakers or fuse-activated relay switches. When a fuse-activated relay switch is used, before the device and the system can be returned to normal operation, the fuse must be manually replaced. In some applications involving low currents, for instance in a system where sales and inventory information is fed from cash registers in a store to a computer, breakers and fuses lack sufficient sensitivity and are impractical to use. In addition, for such application fuses may be fragile.

Other means for isolating devices may examine the information carried by the signal from each device. When a fault occurs this information may indicate the approximate location of such fault. Isolation action using relay switches is based upon the said information. Isolator units of this sort are constructed to accomodate a fixed number of devices. Because the number of devices protected may be less than the number of devices for which the isolator unit was designed, these units may have a large, unused, unnecessary isolation capacity. Thus, while solving the problems associated with the use of breakers and fuses, these units can be very expensive. Furthermore, isolator units of this type require a single, fixed location, usually very close to the master device, such as a computer, which receives signals from and transmits signals to the elemental devices. Cables must be run from each elemental device to the isolator unit. Therefore, because of the single, fixed location of this isolator unit, cable costs can be significant.

Also, if the locations of the elemental devices are shifted, the cables must also be shifted. During such a move, cables are susceptible to damage. If a cable is damaged, part or all of the cable from the elemental device to the isolator unit may have to be replaced, thus further increasing cable costs.

With a view to overcoming these problems, the invention provides a method for isolating and by-passing a device, line or circuit, and an isolator station, or loop fault isolator, for implementing same. The isolator station comprises one or more isolator units and an interface unit. The station simultaneously monitors the acceptability, or quality, of both currents and voltages at points immediately before and immediately following each protected device. The measurements of current and voltage are performed in such fashion that there is no significant change in the measured signal. When the acceptability of the signal changes between the defined measuring points, a fault is present in the protected system. Depending on the specific changes in the signal, the approximate location of the fault can be identified and the faulty device isolated and by-passed. The acceptability of the signal changes if the current, the voltage, or both, do not fluctuate within and up to the limits of a predetermined, acceptable range. These faults correspond to open circuits, short circuits, or other faults in the protected system.

When the fault conditions persist beyond a predetermined delay period, the isolator station will operate to isolate and by-pass the defective device by activating relay switches. The delay period allows the system to withstand transient conditions, such as those occurring when a device is switched on or off, without triggering the isolator unit.

STATEMENT OF INVENTION

The invention comprises a method and device for locating, isolating and by-passing a defective electrical device in an electrical circuit, and comprises sensing current and voltage at a first point in such circuit, on one side of such device, whereby the current and voltage are not significantly altered by the sensing process, sensing current and voltage at a second point in such circuit, on the other side of such device, whereby the current and voltages are not significantly altered by the sensing process, comparing such currents and voltages as between such two points, creating a control signal responsive to such compared currents and voltages, and, isolating such device from such circuit, and thereafter re-establishing such circuit whereby to by-pass such device, in response to a control signal of predetermined characteristics.

The advantages of the invention include the following:

Breakers and fuses are not used and the problems associated with same are avoided. A system of devices can be protected by an isolator station having a number of isolator units, corresponding to the number of devices in the system to be protected, added together in modular fashion. Thus the capacity of the protection system can be optimized by matching it to the protected system. The cost of the protection system is thereby minimized. Furthermore, because of the modular design of an isolator station, suitably-sized isolator stations may be placed in close physical proximity to groups of elemental devices at various locations amongst the elemental devices. Only a single permanent cable or bus connects the protection stations and transmits signals between the protection stations and the master device. Numerous long cables can be eliminated and risk of damage during move can be minimized, thereby reducing costs. An isolator station has the added advantage of being able to determine whether a fault lies within the input or the output circuits and lines of the defective elemental device.

Accordingly, it is an object of this invention to provide a means and a method for determining when a device has operated for a certain length of time outside of its normal voltage and current ranges, and, actuated either manually or automatically by said determination, to isolate and by-pass the said device.

It is a further object of the invention that the said means and method also determine whether a fault lies within the input or the output circuits and lines of the device.

It is a further object of the invention that a series of isolator units can be combined in modular fashion to match the protected system of devices, thus minimizing the cost of the protection system and allowing for expansion or diminution of same.

It is a further object of the invention that the isolator stations may be placed in relatively close physical proximity to the protected devices, allowing a single permanent cable or bus to connect the isolator stations to the master device and decreasing the length and cost of cable from the protected system to the protection system.

In a specific embodiment of the invention, the isolator stations connect to and protect a system of cash registers, which communicate regarding sales, inventory and related information with a computer.

The various features of novelty which characterize the invention are pointed out with particularity in the claims annexed to and forming a part of this disclosure. For a better understanding of the invention, its operating advantages and specific objects attained by its use, reference should be had to the accompanying drawings and descriptive matter in which there are illustrated and described preferred embodiments of the invention.

IN THE DRAWINGS

FIG. 6 is a schematic diagram of an interface unit.

Figure 1:
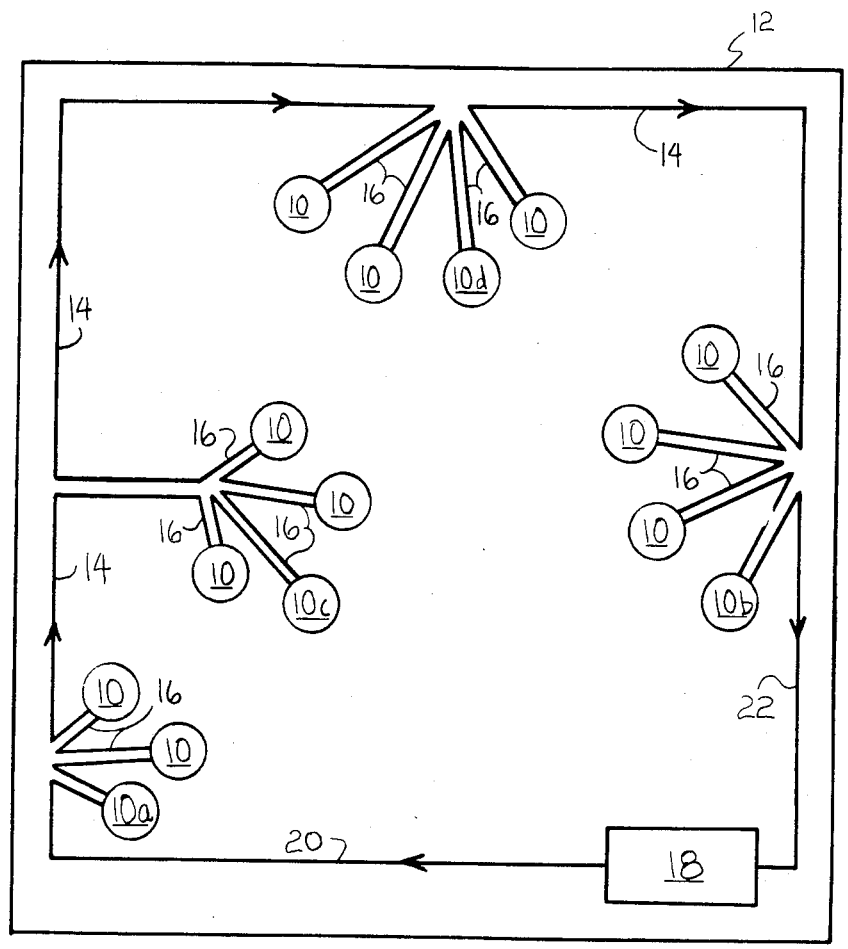
FIG. 1 is a schematic diagram of a system of elemental devices connected in series to a master device.

Referring now to FIG. 1, in the system illustrated, a plurality of elemental devices 10, which typically might be cash registers scattered throughout a sales floor 12, are connected in series to each other via lines 14 and 16. A device 10a, first in the series of devices 10, is connected in series to a master device 18, which typically may be a computer, via input line 20. A device 10b, last in the series of devices 10, is connected in series to master device 18 via output line 22. In this case, each device 10 is an active device having its own power supply. Devices 10 could also be passive devices.

All lines required to carry signals transmitted between devices (such as lines 14, 16, 20, 22 and others described hereunder) typically may be two wire shielded cable. In such a cable, signals are defined by the voltage difference between the two wires which are electrically insulated from each other. The cable is protected from external electro-magnetic interference by an electrically grounded metal sleeve, wrapped around the two wires. In any situation where two or more such signal carrying cables are in close physical proximity to each other, the individual insulated wires of each cable may be enclosed together in a single common shield.

Signals from master device 18, which may typically contain pricing or credit card information to the cash registers or acknowledgements of signals received from particular devices, are transmitted to the series of devices 10 through line 20. Information or instructions may be addressed to a particular device, such as device 10c, by using an address code, unique to such device 10c. Device 10c will recognize its address code and will accept and may act on the information or instructions received from master device 18. Having accepted a signal, device 10c may replace that signal with a signal acknowledging receipt or reporting on the results of any action taken by device 10c to master device 18. If a specific acknowledgement of receipt signal is not sent by device 10c, device 10c may send an idle signal, indicating only that device 10c is operational but idle. Any subsequent device 10 or master device 18 may replace such an idle signal with a fresh signal. No other device 10 will respond to the address code of device 10c and each other device 10 will re-transmit the message addressed to device 10c without alteration. Each other device 10 will accept only messages addressed to its unique address code. In other words, each device 10 receives and re-transmits the signal received from the previous device 10. If a device 10 recognizes a message addressed to it, the message may not necessarily be re-transmitted. Rather the device may act according to the message and may insert a response signal from it into the signal transmitted to the next device 10.

Signals from the series of devices 10, which typically may be sales, inventory or credit information, are transmitted to master device 18 through line 22. Information may be sent by a particular device, such as device 10c, to the master device 18 in association with an identification code. Master device 18 is able to recognize the signal as originating from device 10c because of the identification code. Accordingly, master device 18 may act as required or merely store the information.

Use of address and identification codes allows each device 10 to have two-way communication with master device 18 over a single cable.

In the unprotected system illustrated in FIG. 1, if any device 10, such as device 10d, becomes defective, the entire system will be affected. A defective device 10d may seriously affect the signal transmitted by it. The defective signal may subsequently be re-transmitted throughout the following series of devices 10.

Figure 2:
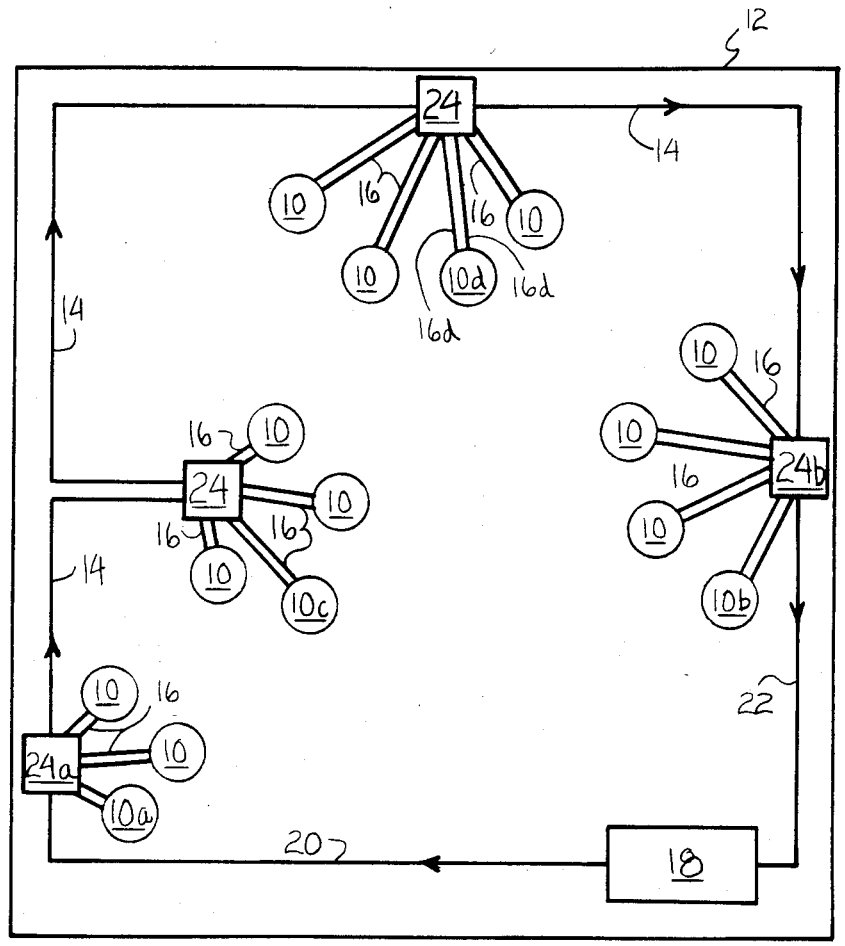
FIG. 2 is a schematic diagram of a system of protected elemental devices connected in series to a master device.

Referring now to FIG. 2, the foregoing system has been fitted with a protection system, according to the invention.

Elemental devices 10 are connected in series to each other through isolator stations 24, 24a and 24b, via cables 16. Isolator stations 24, 24a and 24b are connected in series to each other via lines 14. An isolator station 24a, first in a series of isolator stations 24, 24a and 24b, is connected in series to master device 18 via input line 20. An isolator station 24b, last in the series of isolator stations 24, 24a, and 24b, is connected in series to master device 18 via output line 22. Signals between elemental devices 10 and master device 18 pass unchanged through their associated isolator stations 24, 24a or 24b. Isolator stations 24, 24a and 24b, do not add to or alter the information or the signals passing through them, but merely act as conduits for such information and signals. If any elemental device 10, such as device 10d, is defective, its associated isolator station 24, 24a or 24b, will detect such defect and isolate and by-pass the said defective device 10d and its associated input and output lines 16d. Any such isolated device 10d will not affect the information and signals from the other elemental devices continuing to pass through the system to the master device 18.

The foregoing system is described only in order to illustrate one embodiment of the invention. The invention is in no way confined to applications in identical or similar systems, but comprehends all uses and applications where the detection of electrical faults and isolation and by-passing are required. In particular, a protected device may include any kind of electrical device, line or circuit being either active or passive.

Figure 3:
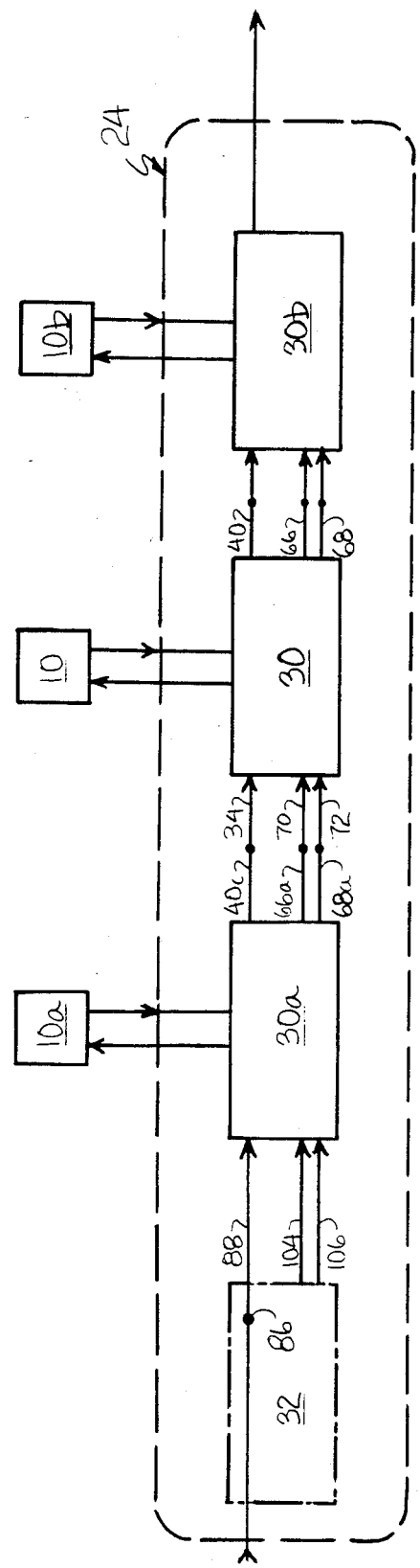
FIG. 3 is a schematic diagram showing the connection in series of several protection units and an interface unit, together forming a protection station.

As shown in FIG. 3, isolator stations 24 each comprise a combination of isolator units 30 and an interface unit 32, connected in series.

Figure 4:
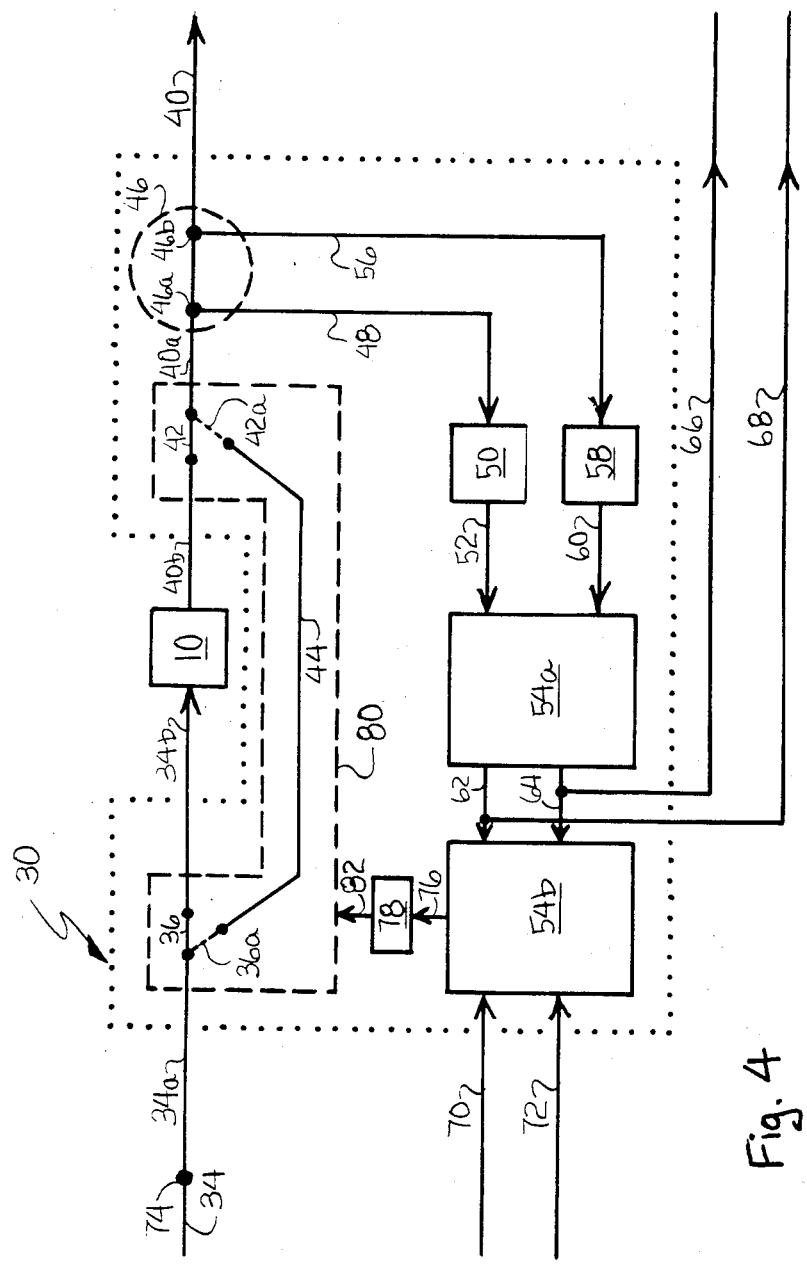
FIG. 4 is a block diagram of a system, being a single protection unit protecting a single device.
Figure 5:
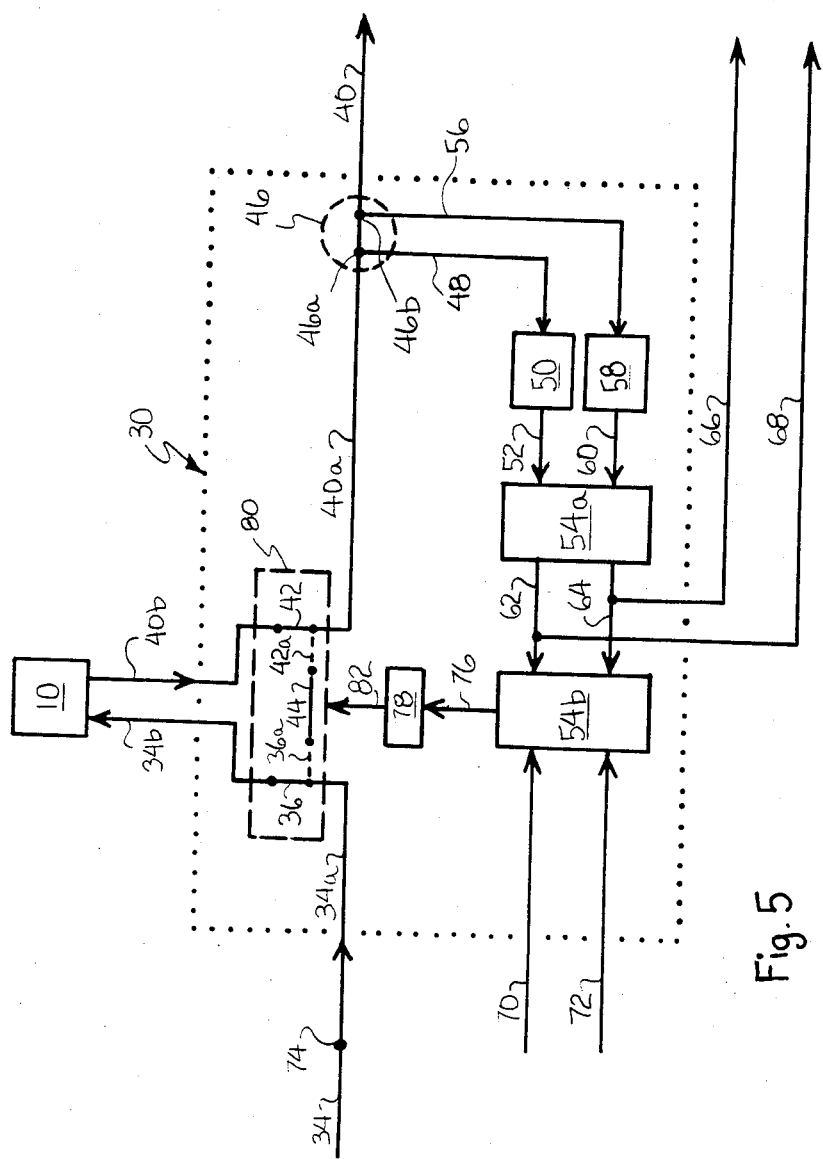
FIG. 5 is a schematic diagram illustrating the same system as shown in FIG. 4.

FIGS. 4 and 5 illustrate an individual isolator unit 30, and its relationship to an elemental device 10. Input line 34 carries the signal from the previous elemental device (not shown) through closed input switch 36 to elemental device 10. Information may be inputted to elemental device 10, as for example, by an operator typing at a keyboard (not shown, but being part of device 10). Device 10 may add such information to the signal or perform such other operations on the signal as required. Output line 40 carries the signal through closed output switch 42, containing the combined information from elemental device 10 and all previous elemental devices (not shown), to the subsequent elemental device (not shown). By-pass line 44 connects input line 34 and output line 40 directly through by-pass input switch 36a and by-pass output switch 42a. When no fault is present in device 10, lines 34 and 40, by-pass switch 36a and 42a are in the open position. When a fault is present, by-pass switches 36a and 42a will close (shown in phantom) and switches 36 and 42 will open.

Measurements of current and voltage in output line 40 are made at point 46, immediately following the device 10. Notionally, point 46 may be considered as two measuring points 46a and 46b for the current and the voltage measurements, respectively. The current measurement may be made by any suitable means. In this embodiment, a transformer transducer (not shown) establishes a voltage in current line 48 proportional to the current in output line 40. The said measurements of current and voltage are made in such a fashion that the signal in output line 40 is not significantly affected by the measuring process. In further embodiments, a measurement of current may be made by using a specially adapted voltage measuring device. Similarly, a measurement of voltage may be made by using a specially adapted current measuring device.

The signal established in current line 48 is passed to a current measuring means 50, which will determine whether the current in output line 40 is within a pre-determined, acceptable range. If the current is not within the acceptable range, current measuring means 50 will have one of two possible outputs. If the current is within the acceptable range, current measuring means 50 will have the second of the two possible outputs. Thus, it can be seen that current measuring means 50 yields a binary output in line 52 dependent on the acceptability of the current in output line 40. The binary signal from current measuring device 50 is passed via line 52 to comparator means 54a.

The voltage of output line 40 is passed directly through voltage line 56 to a voltage measuring means 58, which will determine whether the voltage in output line 40 fluctuates within and up to the limits of a pre-determined, acceptable range. If the voltage exceeds the said limits or if the voltage fluctuations fall within a significantly decreased range, the voltage of output line 40 will be determined to be unacceptable.

Voltage measuring means 58 will also yield a binary output, depending on the acceptability of the voltage in output line 40. The binary signal from voltage measuring means 58 is passed via line 60 to comparator means 54a.

Comparator means 54a will combine the information received from current measuring means 50 and voltage measuring means 58 to provide two different binary signals, TRIP/$\overline{\text{TRIP}}$ and OK/$\overline{\text{OK}}$, containing information on its acceptability of current and voltage at point 46. The operation of comparator 54a is described below in detail. The said two binary signals are transmitted to a second comparator means 54b via lines 62 and 64 and to a subsequent isolator unit (not shown) via lines 66 and 68.

Comparator means 54b, in addition to lines 62 and 64, receives signals via lines 70 and 72 from a previous isolator unit (not shown) regarding the acceptability of the current and voltage at measuring point 74, immediately prior to device 10.

Comparator means 54b compares the inputs it receives from lines 62, 64, 70 and 72 regarding the acceptability of the currents and voltage at measuring points 74 and 46. Based on the comparison, comparator means 54b will determine whether a fault lies between points 74 and 46. The comparator means 54b will yield a binary output depending on whether it has determined that a fault exists between points 74 and 46. The binary signal from the comparator means 54b is passed via line 76 to relay delay means 78.

If a fault is determined to exist between points 74 and 46, the binary output to relay delay means 78 will change, causing a timer (not shown) within relay delay means 78 to commence timing. If comparator means 54b ceases to detect a fault between points 74 and 46 within a pre-set time, the timer will reset and no signal will pass to relay switch means 80. However, if the fault conditions do not cease within the pre-set time, the timer will trigger relay switch means 80 via line 82, causing switches 36 and 42 to open and by-pass switches 36a and 42a to close. The switching of relay switch means 80 isolates elemental device 10 and portion 34b of input line 34 and portion 40b of output line 40, and allows signals from previous isolator units (not shown) to by-pass elemental device 10.

It should be noted that action of relay switch means 80 is dependent on the existence of a fault lying anywhere between the measuring points 74 and 46. The fault may lie anywhere in device 10, those portions 34a and 34b of input line 34 lying between point 74 and device 10 or those portions 40a and 40b of output line 40 lying between device 10 and point 46. Depending on the specific binary signals entering comparator 54b, as more fully described in the paragraphs and table below, it is possible for comparator 54b to determine whether a fault lies within the input circuits, including input line portions 34a and 34b of device 10 or within the output circuits, including output line portions 40a and 40b, of device 10. If relay switch means 80 is operated, only device 10, input line portion 34b, and output line portion 40b are isolated. If the fault that triggered such operation in fact lies in input line portion 34a or output line portion 40a, the faulty line will not be isolated and will therefore interrupt or affect the entire system. In practice, however, the risk of a fault occurring in portions 34a or 40a is minimal, because of the close physical proximity of point 74 to switch 36 and of switch 42 to point 46 and the solid connections therebetween.

In operation, if comparator means 54a receives UNACCEPTABLE signals from both current measuring means 50 and voltage measuring means 58, the binary signal in line 66 will be in the $\overline{\text{TRIP}}$ state and in line 68 in the $\overline{\text{OK}}$ state. UNACCEPTABLE from voltage measuring means 58 and ACCEPTABLE from current measuring means 50, will yield the TRIP state in line 66 and OK in line 68. UNACCEPTABLE from current measuring means 50 and ACCEPTABLE from voltage measuring means 58 will also yield TRIP in line 66 and OK in line 68. ACCEPTABLE from both current measuring means 50 and voltage measuring means 58 will yield $\overline{\text{TRIP}}$ in line 66 and OK in line 68. A combination of TRIP and $\overline{\text{OK}}$ signals is not possible.

The inputs to comparator means 54b through lines 70 and 72 provide the equivalent current and voltage information in relation to measuring point 74.

As illustrated in FIG. 3, three isolator units 30a, 30, and 30b have been connected in series. Control signal output lines 66a and 68a from the first isolator unit 30a connect to the control signal input lines 70 and 72 of the second isolator unit 30. Similarly, data output line 40c from the first isolator unit 30a connects to the data input line 34 of the second isolator unit 30. In the same fashion any number of isolator units may be connected in series, simply by joining the output lines of a prior unit to the input lines of a subsequent unit. Thus, a single isolator unit may be considered to be an isolator unit module.

Referring to FIGS. 4 and 5, by comparing the inputs to comparator means 54b from lines 62, 64, 70 and 72, the location of a fault can be identified by said comparator means 54b as follows: T,0170

Other combinations of signals not shown in the above table cannot occur.

In the Table above, any particular combination of signals from points 74 and 46 gives an indication as to the location of the fault for the following reasons:

Condition 1. There is no fault in device 10 because both current and voltage are ACCEPTABLE at both points 74 and 46.

Condition 2. The fault is after point 46, because current and voltage are ACCEPTABLE at points 74, and either voltage or current is ACCEPTABLE and the other UNACCEPTABLE at point 46. If the fault (i.e. an open or a short circuit) were before point 46, both voltage and current at point 46 would be UNACCEPTABLE. An open circuit would yield zero voltage and current. A short circuit would yield zero or low voltage and current. The fault must therefore be located after point 46.

Condition 3. There is a fault in the output circuits of device 10 (including output line portion 40a and 40b), because both current and voltage are ACCEPTABLE at point 74, but UNACCEPTABLE at point 46. If the fault were between point 74 and the input circuits of device 10, either the current or voltage at point 76 would be UNACCEPTABLE. The fault must therefore be between the output circuits of device 10 and point 46. There may in addition also be a further fault after point 46. The signals which would normally indicate such a fault (see #2 above) would be hidden by the UNACCEPTABLE signals at point 46, caused by the preceding faults.

Condition 4. A fault precedes point 74, because both current and voltage are UNACCEPTABLE at point 74, but ACCEPTABLE at point 46. If there were a fault in the output of device 10 or after point 46, either voltage, current or both at point 46 would be UNACCEPTABLE. There may also be an additional fault in the input circuits of device 10, which may be hidden by the UNACCEPTABLE signals at point 74, caused by the preceding fault.

Condition 5. A fault precedes point 74 (see #4 above). There may also be additional faults located in the input circuits of device 10 (see #4 above) or after point 46 (see #2 above).

Condition 6. A fault precedes point 74 (see #4 above). There may also be additional faults in the input circuits (see #4 above), in the output circuits (see #3 above), or after point 46 (see #3 above).

Condition 7. The fault is located in the input circuits of the device 10 (including the input line portion 34a and 34b), because either current or voltage is UNACCEPTABLE at point 74. Such conditions indicate that the fault lines after point 74 (see #2 above, but considering point 74 rather than point 46). Because both current and voltage are ACCEPTABLE at point 46, there is no fault after 46 (see #2 above) and there is no fault in the output circuits of device 10 (see #3 above). The fault must therefore lie in the input circuits of device 10.

Condition 8. There is a fault in the input circuits of device 10 (see #7 above ). In addition there may be an additional fault after point 46 (see #2 above).

Condition 9. There is a fault in both the input circuits of device 10 (see #7 above) and in the output circuits (see #3 above). In addition, there may be a further fault after point 46 (see #3 above).

If a fault is identified by comparator means 54b as being between points 74 and 46, comparator means 54b will send a signal to relay delay means 78. If the fault persists for longer than the pre-set time, the relay switch means 80 will operate to isolate and by-pass device 10 and line portions 34b and 40b.

If the fault is identified as either preceding point 74 or succeeding point 46, isolator units 30a or 30b (see FIG. 3), respectively, acting in fashion identical to unit 30, may operate to isolate and by-pass its associated device 10a or 10b and input and output line portions (not shown). In order to isolate all defects in a series of devices, the first isolator unit in the series to detect a defect in its device will isolate and by-pass its device. If defective signals continue to be present at the next subsequent isolator unit, it also will by-pass its device. If however the operation of the first unit removes the defect signals at subsequent units, such units will not operate. Rather, their associated devices will continue to function normally and will not be by-passed.

In order that a series of isolator units be functional, the first device in any such series must be an interface unit to provide a determination as to the acceptability of the signal in the input line to the first isolator unit of the series.

FIG. 3 illustrates a series of isolator units 30a, 30 and 30b and interface unit 32, combined in series to form isolator station 24. Interface unit 32, as shown in FIG. 6, is different from an isolator unit 30, as shown in FIGS. 4 and 5, in that interface unit 32 does not possess the equivalent of input lines 70 and 72 or comparator means 54b. Interface unit 32 does not function to isolate an elemental device. The purpose of interface unit 32 is to send appropriate combinations of TRIP and OK signals, generated from its observations of current and voltage signals at point 86, to isolator unit 30a.

FIG. 6 shows the functions of the interface unit 32. Measuring point 86 is a point on input line 88 carrying the signal either from a previous isolator station (not shown) or from the master device (not shown). At point 86a which is part of 86, a current measurement is taken and passed through line 90, current measuring means 92 and line 94 to comparator means 96 in a fashion similar to that done in isolator unit 30. At point 86b, which is also part of point 86, a voltage measurement is taken and passed through line 98, voltage measuring means 100, and line 102 to comparator means 96 in a fashion similar to that done in isolator unit 30. Comparator means 96 functions identically to comparator means 54a. Output line 104 will carry a binary signal, TRIP or $\overline{\text{TRIP}}$. Output line 106 will carry a binary signal, OK and $\overline{\text{OK}}$. The combination of such binary signals will be the same as found in isolator unit 30, and will depend on the acceptability of current and voltage at point 86. Lines 104 and 106 become the input lines to isolator unit 30a, corresponding to lines 70 and 72, respectively, in isolator unit 30.

In operation, isolator unit 30, which is part of an isolator station 24, may detect a fault between its associated measuring points 74 and 46. If the fault persists for longer than the pre-determined delay period, isolator unit 30 will operate to isolate and by-pass device 10 and line portions 34b and 40b. Suitable display means (not shown) attached to isolator unit 30 may display the state of the input lines 70 and 72 and output lines 66 and 68, which contain TRIP and OK signals.

Such a display may allow the operator to determine the location of the fault between the measuring points 74 and 46, as described hereinbefore. Upon repair of the fault, device 10 may be removed from isolation and isolator unit 30 restored to its operating condition by resetting the relay switch means 80 by a suitable manually operated resetting means (not shown).

In a further embodiment of the invention, it is possible to have an isolator unit using a measuring point positioned prior to its associated elemental device. Such an embodiment requires a subsequent isolator unit or interface unit to send information regarding the acceptability of current and voltage at a point following the protected device to the isolator unit in question. In this embodiment note that any series of isolator units must have an interface unit as the last unit in the series. The test conditions of acceptability upon which a signal from the comparator means to the relay delay means is based must be modified accordingly.

In a further embodiment, it is possible to pass the binary signals—current "ACCEPTABLE"/"UNACCEPTABLE" and voltage "ACCEPTABLE"/"UNACCEPTABLE"—directly from isolator or interface unit to isolator unit, rather than TRIP/$\overline{\text{TRIP}}$ and OK/$\overline{\text{OK}}$ signals. The design of the comparator means must be changed accordingly. Other control combinations may be transmitted between isolator units. For example, three control signals may be sent as follows: "this device is operating acceptably, "the fault precedes this device", and "the fault follows this device".

In a further embodiment, a relay delay timer may not be used.

In a further embodiment, a relay delay timer may pass a binary signal to a suitable display means, and not directly to a relay switch means. The said display means provides information to a human operator who may manually operate switches to isolate and by-pass the defective device.

The foregoing is a description of preferred embodiments of the invention which is given here by way of example only. The invention is not to be taken as limited to any of the specific features as described, but comprehends all such variations thereof as come within the scope of the appended claims.

What is claimed is:

1. A method for locating, and isolating and by-passing a defective electrical device in an electrical circuit, and comprising the steps of;
    sensing current and voltage at a first point in such circuit, on one side of such device, whereby the current and voltage at said first point are not significantly altered by the sensing process;
    sensing current and voltage at a second point in such circuit, on the other side of such device, whereby the current and voltage at said second point are not significantly altered by the sensing process;
    comparing such currents and voltages at said two points;
    creating a control signal responsive to such compared currents and voltages, and,
    isolating such device from such circuit, and thereafter re-establishing such circuit whereby to by-pass such device, in response to a control signal of pre-determined characteristics.

2. A method as claimed in claim 1 wherein the method further includes a pre-determined delay between such sensing and such isolation and re-establishment.

3. An isolator unit device comprising a relay switch means, a current measuring means and a voltage measuring means for determining the acceptability of the current and voltage at a first point on one side of an electrical device, line or circuit, and a comparator means to compare the acceptability of current and voltage at the said first point with the acceptability of current and voltage at a second point on the other side of the said device, line or circuit, to determine whether a defect exists between the said points, to determine the location of a defect, if such is found to exist, between the said points, and to deliver a control signal to said relay switch means operable to isolate and by-pass the said device, line or circuit if a defect is found to exist between the said points.

4. An isolator unit as claimed in claim 3 wherein said first point is a point after a protected device, line or circuit and the said second point is a point before the said device, line or circuit.

5. An isolator unit as claimed in claim 3 where the said first point is a point before a protected device, line or circuit and the said second point is a point after the said device, line or circuit.

6. An isolator unit device as claimed in claim 4 wherein the said comparator has output means to deliver control signals to another isolator unit device and input means to receive control signals from another isolator unit device.

7. An isolator unit device as claimed in claim 5 wherein the said comparator has an output means to deliver control signals to another isolator unit device and input means to receive control signals from another isolator unit device.

8. An isolator unit device as claimed in claim 6 wherein the said isolator device is connected in series with at least one other similar isolator device, all of said isolator devices forming a series of such isolator devices wherein the output means of a prior isolator device is connected to the input means of a subsequent isolator device.

9. An isolator unit device as claimed in claim 7 wherein the said isolator device is connected in series with at least one other similar isolator device, all of said isolator devices forming a series of such isolator devices wherein the output means of a prior device is connected to the input means of a subsequent isolator device.

10. An isolator unit device as claimed in claim 8 wherein the said series of isolator devices is connected in series to an interface unit, which unit comprises a current measuring means and a voltage measuring means for determining the acceptability of the current and voltage at a point in an electrical device, line or circuit and includes an output means to deliver control signals to a first of said isolator unit devices in the said series of such isolator devices.

11. An isolator unit device as claimed in claim 9 wherein the said series of isolator devices is connected in series to an interface unit, which unit comprises a current measuring means and a voltage measuring means for determining the acceptability of the current and voltage at a point in an electrical device, line or circuit and includes an output means to deliver control signals to a last of said isolator unit devices in the said series of such devices.

12. An isolator station, for use in association with a series of electrical devices, lines or circuits, comprising:
a plurality of isolator unit devices connected in series to each other, each isolator unit device comprising a relay switch means, a current measuring means and a voltage measuring means for determining the acceptability of the current and voltage at a first point on one side of one said electrical device, line or circuit, and a comparator means to compare the acceptability of current and voltage at the said first point with the acceptability of current and voltage at a second point on the other side of the said one device, line or circuit, to determine whether a defect exists between the said points, to determine the location of a defect, if such is found to exist, between the said points, and to deliver a control signal to said relay switch means operable to isolate and by-pass the said one device, line or circuit if a defect is found to exist between the said points, and,
an interface unit connected to one of said isolator unit devices, which interface unit comprises a current measuring means and a voltage measuring means for determining the acceptability of the current and voltage at a point in an electrical device, line or circuit and includes an output means to deliver control signals to said one isolator unit device.

13. An isolator station as claimed in claim 12 wherein the comparator means has output means to deliver control signals to antoher isolator unit device and input means to receive control signals.

14. An isolator station as claimed in claim 13 wherein one isolator unit device receives control signals from the interface unit and the other said isolator unit devices are connected to each other to receive control signals from a previous isolator unit device and to deliver control signals to a subsequent isolator unit device.

15. An isolator station as claimed in claim 13 wherein one isolator unit receives control signals from the interface unit and the other said isolator unit devices are connected to each other to receive control signals from a subsequent isolator unit device and to deliver control signals to a previous isolator unit device.

* * * * *